United States Patent [19]

Kanayama et al.

[11] Patent Number: 5,894,657
[45] Date of Patent: *Apr. 20, 1999

[54] MOUNTING APPARATUS FOR ELECTRONIC COMPONENT

[75] Inventors: Shinji Kanayama, Kashihara; Akira Kabeshita, Hirakata; Satoshi Shida, Katano; Kohei Enchi, Osaka; Kenji Takahashi, Katano, all of Japan

[73] Assignee: Matsushita Electric Industrial Co., Ltd., Kadoma, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/569,937

[22] Filed: Dec. 8, 1995

[30] Foreign Application Priority Data

Dec. 8, 1994 [JP] Japan .................. 6-304636

[51] Int. Cl.⁶ ................... H05K 3/30; H05K 13/04
[52] U.S. Cl. ................... 29/740; 29/721; 29/741; 29/743; 901/40
[58] Field of Search ................... 29/721, 739, 740, 29/741, 743, 759; 901/40, 47; 294/2, 64.1

[56] References Cited

U.S. PATENT DOCUMENTS

| | | | |
|---|---|---|---|
| 4,372,802 | 2/1983 | Harigane et al. | 29/743 X |
| 4,881,319 | 11/1989 | Yagi et al. | 29/740 X |
| 4,951,383 | 8/1990 | Amao et al. | 29/740 X |
| 5,033,185 | 7/1991 | Hidese | 29/743 X |
| 5,093,984 | 3/1992 | Lape | 29/743 X |
| 5,145,047 | 9/1992 | Terracol et al. | 29/759 X |
| 5,172,468 | 12/1992 | Tanaka et al. | 29/740 X |
| 5,195,235 | 3/1993 | Mifuji | 29/740 X |
| 5,233,745 | 8/1993 | Morita | 29/743 X |
| 5,271,139 | 12/1993 | Sticht | 29/721 X |
| 5,323,528 | 6/1994 | Baker | 29/740 X |
| 5,377,405 | 1/1995 | Sakurai et al. | 29/740 X |
| 5,379,514 | 1/1995 | Okuda et al. | 29/740 X |

FOREIGN PATENT DOCUMENTS

| | | | |
|---|---|---|---|
| 4027198 | 1/1992 | Japan | 29/743 |
| 5145291 | 6/1993 | Japan | 29/743 |

Primary Examiner—Peter Vo
Attorney, Agent, or Firm—Wenderoth, Lind & Ponack, L.L.P.

[57] ABSTRACT

An electronic component mounting apparatus includes a feeding device for feeding a to-be-placed element including an electronic component, an anisotropic conductive film, or a paste, a holding device for holding the fed element, an element moving device for supporting and moving the holding device in a first direction and placing the element held by the holding device on a circuit board, and a board moving device for holding and moving the circuit board in a second direction generally at right angles to the first direction where the element moving device is moved.

9 Claims, 17 Drawing Sheets

MOUNTING APPARATUS FOR ELECTRONIC COMPONENT

BACKGROUND OF THE INVENTION

The present invention relates to an apparatus for mounting electronic components or the like on circuit boards on an occasion of SMT (Surface Mount Technology) mounting, COB (Chip-On-Board) mounting, COG (Chip-On-Glass) mounting, etc.

In a conventional mounting apparatus of the above-described type, at least either a component mounting head or a circuit board adopts a device for moving in X and Y directions.

FIG. 5 indicates the constitution of the conventional mounting apparatus, in which reference numerals 1–4 are respectively a component carrier head, an X-Y robot, a component cassette or tray used in feeding electronic components, and a circuit board.

The operation of the conventional example of FIG. 5 will be described below.

The component carrier head 1 is set at the X-Y robot 2 and is movable in X and Y directions. Moving in the X and Y directions over the component cassette or tray 3 in the rear part of the equipment, the component carrier head 1 sucks and takes out a necessary electronic component. Then, the component carrier head 1 moves in X and Y directions to a predetermined position of the positionally regulated circuit board 4, to mount the electronic component onto the circuit board.

In the constitution of the above conventional example, it is difficult to feed the electronic components from a front or side face of the equipment because the component carrier head 1 is moved in the X and Y directions by the X-Y robot 2. Since the component carrier head 1 is set on the X-Y robot 2, only one component carrier head 1 can be set on the equipment. Therefore, if it becomes necessary to apply a paste on the circuit board or on the sucked electronic component, an additional function therefor should be assigned to the component carrier head, which forces the component carrier head to carry out an increased number of steps and consequently lengthens the mounting time. Further, rigidity of a coupling section between the X and Y shafts is weak in the system using the X-Y robot, thus deteriorating mounting accuracy.

In order to eliminate the above disadvantages, if the system is adapted in such constitution as to move the circuit board in the X and Y directions and set a plurality of component carrier heads on the equipment, the equipment inevitably becomes bulky in size.

SUMMARY OF THE INVENTION

The object of the present invention is therefore to provide an electronic component mounting apparatus which enables the supply of electronic components from a front face of the equipment, improves mounting accuracy without extending mounting time even when the number of processing steps for necessary functions is increased and without enlarging the equipment.

In accomplishing these and other objects, according to one aspect of the present invention, there is provided an electronic component mounting apparatus comprising:

a feeding device for feeding a to-be-placed element including an electronic component, an anisotropic conductive film, or a paste;

a holding device for holding the fed element;

an element moving device for supporting and moving the holding device in a first direction and placing the element held by the holding device on a circuit board; and a board moving device for holding and moving the circuit board in a second direction generally at right angles to the first direction where the element moving device is moved.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
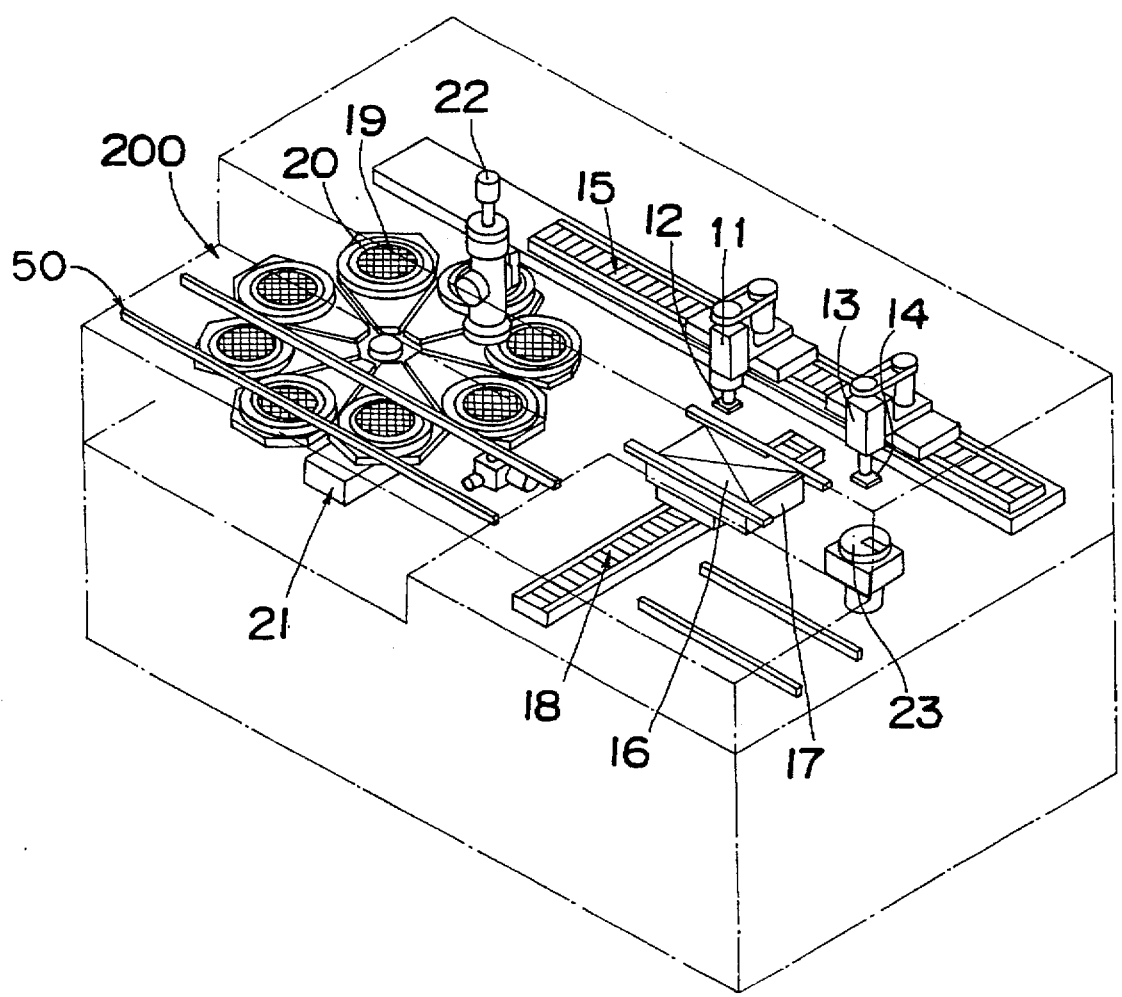
FIG. 1 is a perspective view of an electronic component mounting apparatus in a first embodiment of the present invention.

Before the description of the present invention proceeds, it is to be noted that like parts are designated by like reference numerals throughout the accompanying drawings.

Embodiments of the present invention will be discussed hereinbelow with reference to the drawings.

FIG. 1 shows the constitution of an electronic component mounting apparatus of a COB mounting type according to a first embodiment of the present invention.

Figure 16:
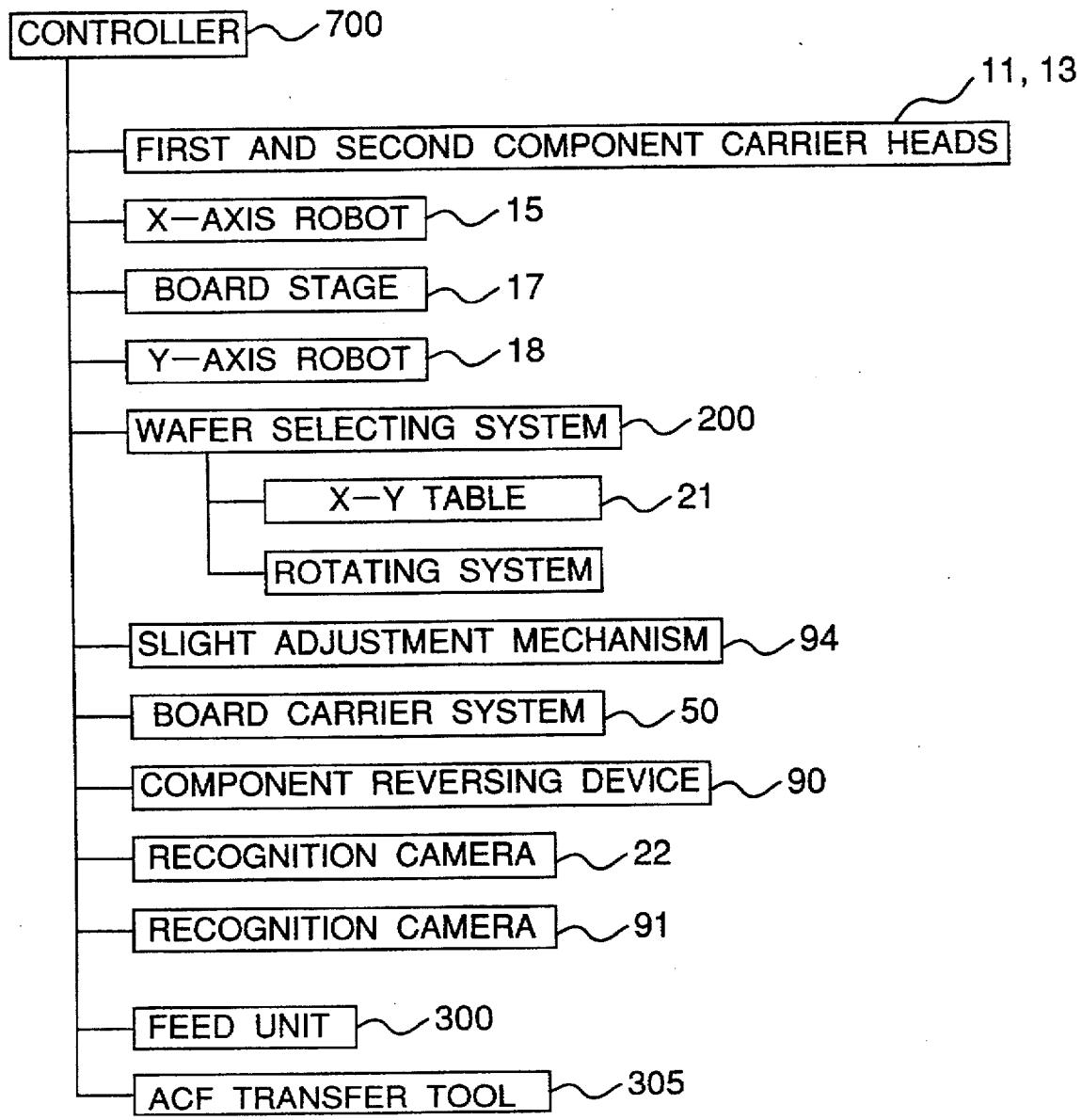
FIG. 16 is a block diagram showing relationship between a controller and devices in the embodiments.

In FIG. 1, reference numerals 11–23 represent respectively: 11 a first component carrier head; 12 a component suction seal at a lower end of the head 11; 13 a second component carrier head; 14 a paste transfer tool at a lower end of the second head 13; 15 an X-axis robot for moving the first and second component carrier heads 11 and 13 independently in a direction of an X-axis through numerical controls; 16 a circuit board; 17 a board stage holding the circuit board 16; 18 a Y-axis robot for driving the board stage 17 in a direction of a Y-axis through numerical control; 19 an electronic component; 20 a wafer which is an aggregate of electronic components 19; 21 an X-Y table which has a function to select a predetermined wafer 20 among a plurality of wafers 20 loaded thereon and movable in the X-axis and Y-axis directions perpendicular to each other; 22 a recognition camera for detecting whether or not the electronic component 19 in the wafer 20 is acceptable and correcting a position of the acceptable electronic component 19 in the wafer 20; and 23 a transfer saucer containing a bonding paste to be used to fix the electronic component 19 onto the circuit board 16. The numerical controls of the X-axis robot 15 for moving the first and second component carrier heads 11 and 13 independently in the X-direction and the numerical control of the Y-axis robot 18 for driving the board stage 17 in the Y-direction are carried out by a controller 700 connected to the X-axis robot 15 and Y-axis robot 17 as shown in FIG. 16.

Figure 7:
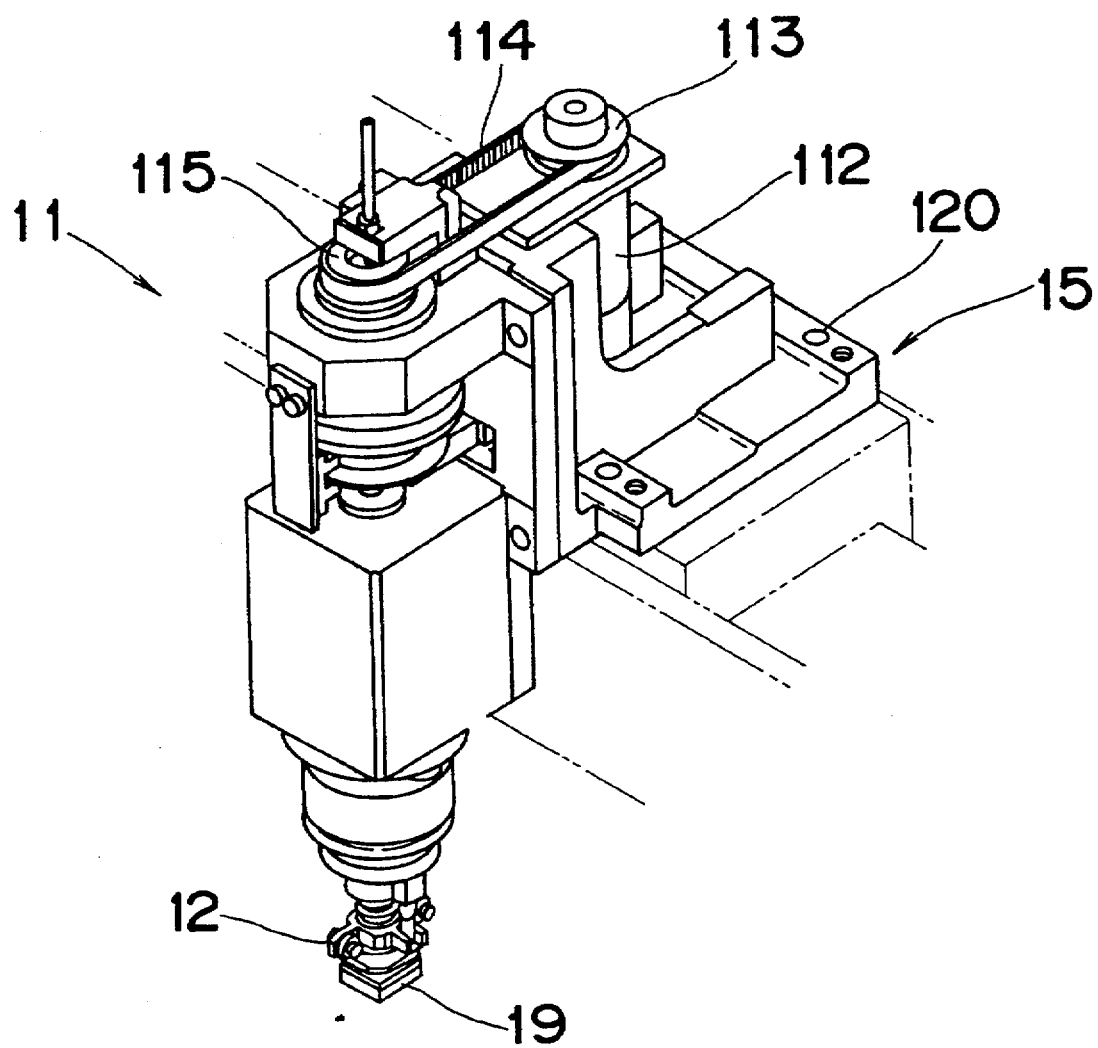
FIG. 7 is a perspective view of a component carrier head of the apparatus in FIG. 1.

The component carrier head 11 is shown in FIG. 7. The head 11 has the suction seal 12 for sucking the component 19 and a rotating mechanism for rotating the suction seal 12 in a θ-direction while sucking the component 19. The rotating mechanism has a motor 112, a driving-side pulley 113 connected to a rotary shaft of the motor 112, a driven-side pulley 115 connected to the driven-side pulley 113 via a belt 114. The motor 112 is fixed on a base 120 connected to a plate 504 of the linear motor described later. Thus, the head 11 can adjust the position of the component 19 sucked at the suction seal 12 thereof in the X-direction and the θ-direction by moving the head 11 by the X-axis robot 15 and rotating the suction seal 12 by the motor 112. The component carrier head 13 has the same construction as the head 11 and can carry out the same operation as the head 11.

Figure 2:
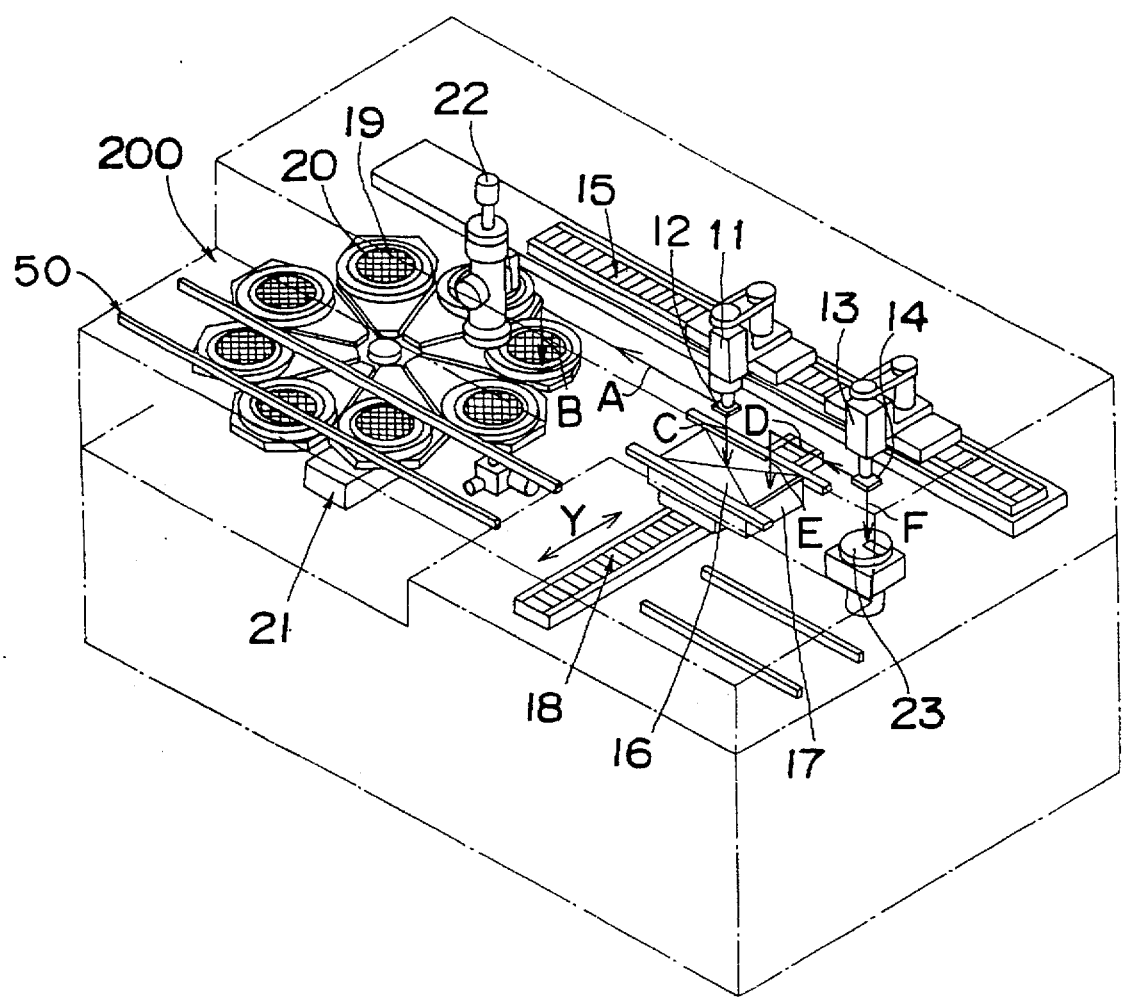
FIG. 2 is a view explanatory of a moving direction of component carrier heads of the apparatus of FIG. 1.
Figure 12:
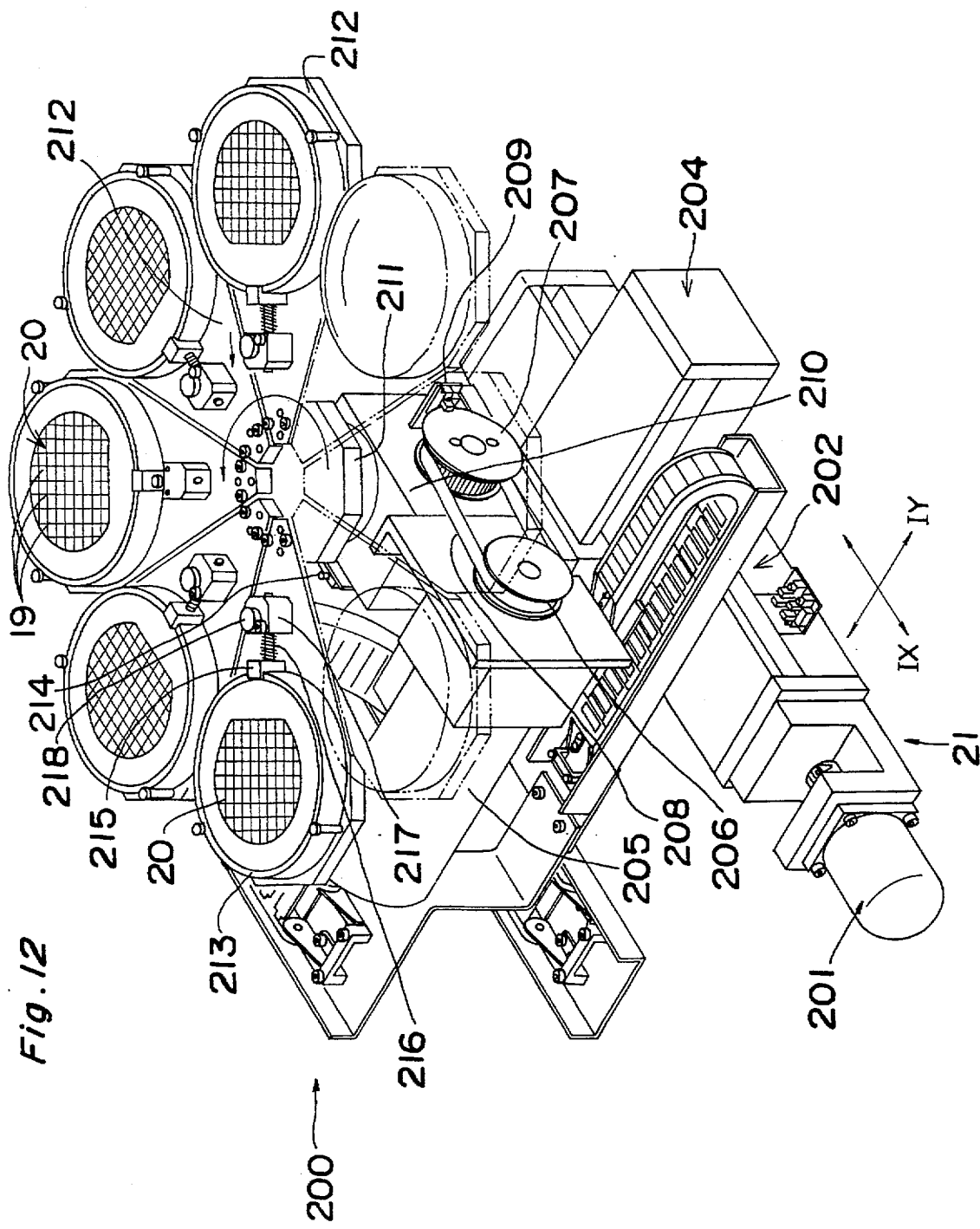
FIG. 12 is a perspective view of a wafer selecting system of the apparatus in each embodiment.

FIG. 12 shows an example of a wafer selecting system 200 in the apparatus of FIGS. 1 and 2. The wafer selecting system 200 has the X-Y table 21 and a rotating system set on the X-Y table 21. The X-Y table 21 has an X-direction driver 202 and a Y-direction driver 204. The X-direction driver 202 has a motor 201 for rotating a ball screw to move back and force in the X-direction a nut engaged with the ball screw and connected to the Y-direction driver 204. The Y-direction driver 204 has a motor 203 (see FIG. 6) for rotating a ball screw to move back and force in the Y-direction a nut engaged with the ball screw and connected to the rotating system. The rotating system has a clutch-and-brake motor 205, a driving-side pulley 206 connected to a rotary shaft of the motor 205, a driven-side pulley 207 connected to the pulley 205 via a belt 208 so as to rotate the driven-side pulley 207 by the motor 205. The driven-side pulley 207 is connected via an indexing device 210 to a base 211 holding eight wafer plates 212 for holding eight wafers 20 thereon. Therefore, the base 211 is rotated together with the eight wafer plates 212 and the eight wafers 20 by the motor 205. Each wafer 20 is surrounded by an expanding member 213 on each wafer plate 212 and is located at a predetermined position thereon via an engaging member 215 by an urging force of a spring 216 applied from a block 217 fixed on the wafer plate 212 while the rear surface of the wafer 20 is adhered to an adhesive sheet (not shown) on the wafer plate 212. The engaging member 215 urged by the spring 216 can be separated from the expanding member 213 by operating a knob 218 to insert into and remove the wafer 20 from the expanding member 213. The rotation of the wafers 20 is detected by a sensor 209 for detecting the rotation of the pulley 207. The original position of the wafer plates 212 is detected by a sensor 214. Thus, the rotary position of the wafer 20 is detected by calculating the original position of the wafer plates 212 and the rotation number thereof detected by the sensors 207 and 214. Therefore, the X-Y position of the wafer 20 is adjusted by moving the rotating system in the X-direction by the X-direction driver 202 and in the Y-direction by the Y-direction driver 204. The rotary position of the wafer 20 is adjusted by the rotating system. Thus, a predetermined wafer 20 and a predetermined component 19 thereof can be selected by the X-Y table 21 and the rotating system.

When one component 19 is sucked from the wafer 20 of the wafer selecting system 200 by the suction seal 12 of the component carrier head 11, a component reversing operation can be carried out by a component reversing device 90 (see FIG. 6) if such a component reversing operation is necessary. That is, the component 19 in the wafer 20 on the wafer selecting system 200 is sucked by a suction element 90a of the component reversing device 90 which is located at its lower position and the suction element 90a sucking the component 19 is rotated 180 degrees to its upper position. The component 19 sucked by the suction element 90a of the component reversing device 90 at its upper position is sucked by the suction seal 12 of the component carrier head 11 before the component 19 is removed from the suction element 90a. Therefore, in the above manner, the bottom surface of the component 19 in the wafer 20 is sucked by the suction seal 12 of the component carrier head 11. It is possible to omit such an operation and device when the upper surface of the component 190 can be sucked by the suction seal 12 of the component carrier head 11.

Figure 13:
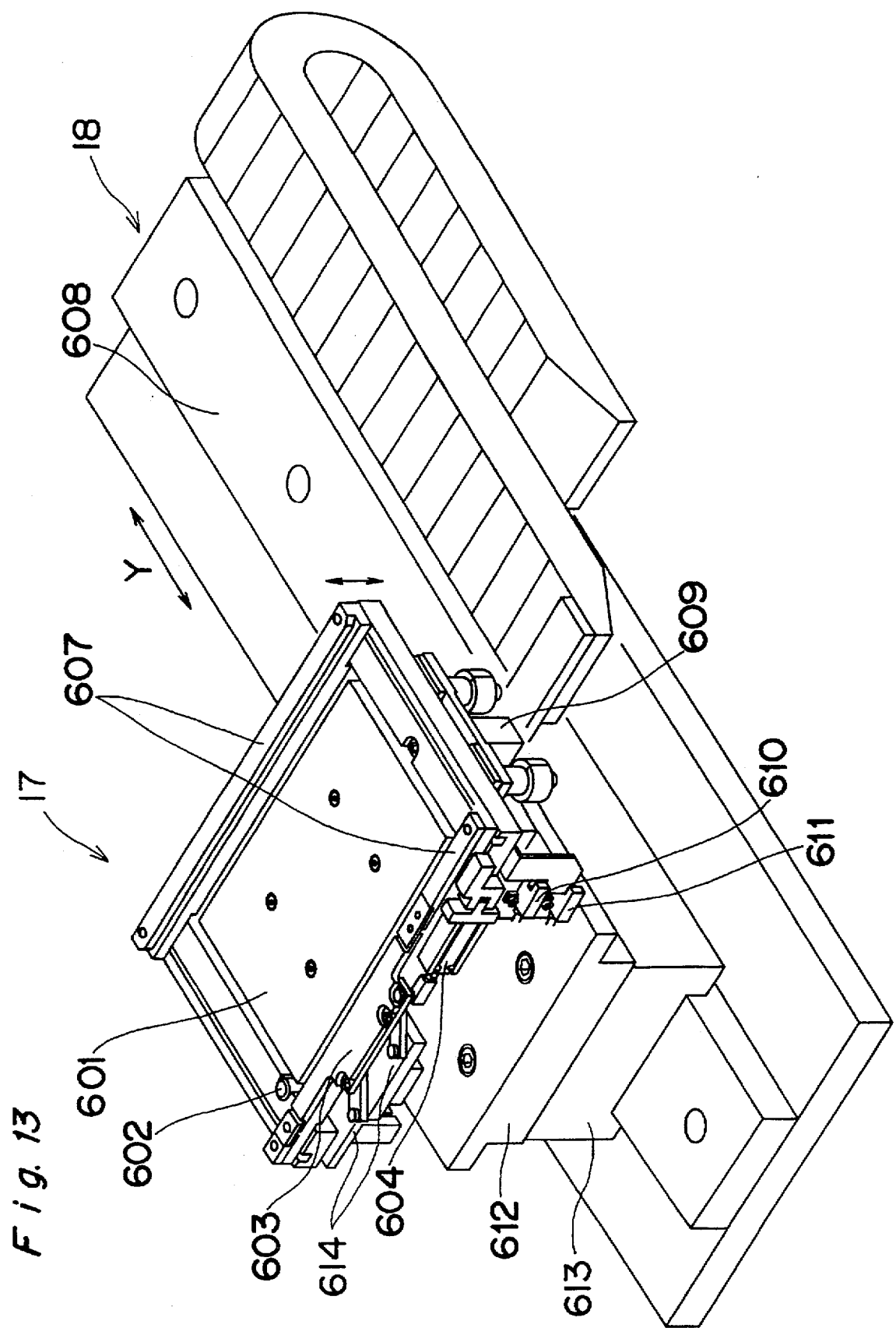
FIG. 13 is a perspective view of a board stage of the apparatus in each embodiment.

FIG. 13 shows an example of the board stage 17. The board stage 17 includes a board suction block 601, a board stopper cylinder 602, a board restriction plate 603, a board restriction cylinder 604, carrier rails 607, a pair of carrier rails up-and-down cylinders 609, an upper limit sensor 610, a lower limit sensor 611, and a base 612. The Y-axis robot 18 includes a Y-direction rail 608 and a driving member 613. The board suction block 601 has many suction holes (not shown) for sucking the positioned board 16 thereon. The board stopper cylinder 602 moves upward and contacts the board 16 so as to stop the board 16 at a predetermined position on the board suction block 601 in the board-carrying-in direction of a board carrier system 50 while being guided by the carrier rails 607. When the board 16 is transferred to the board-carrying-out direction of the board carrier system 50, the board stopper cylinder 602 moves downward so as to not impede or prevent the transfer of the board 16. The board restriction plate 603 is moved by the board restriction cylinder 604 via a parallel link mechanism 614 so as to contact the side of the board 16 positioned on the block 601 with the opposite side carrier rail 607 to position the board 16. The carrier rails 607 guide the board 16 in the board-carrying-in and board-carrying-out directions of the board carrier system 50 in a board transfer path. The carrier rails 607 are supported on the base 612 while the carrier rails 607 can be upward and downward moved by the carrier rails up-and-down cylinders 609 located at the ends of the block 601. The upper and lower limit positions of the carrier rails 607 are restricted by the upper limit sensor 610 and the lower limit sensor 611. The base 612 is fixed on the driving member 613 moving on the Y-direction rail 608 in the Y-direction. The driving member 613 is constructed by one of known various kinds of driving members such as a linear motor in FIG. 14, or a motor and a ball-screw and an engaged nut driven by the motor. The board stage 17 is moved in the Y-direction by the Y-axis robot 18.

Figure 14:
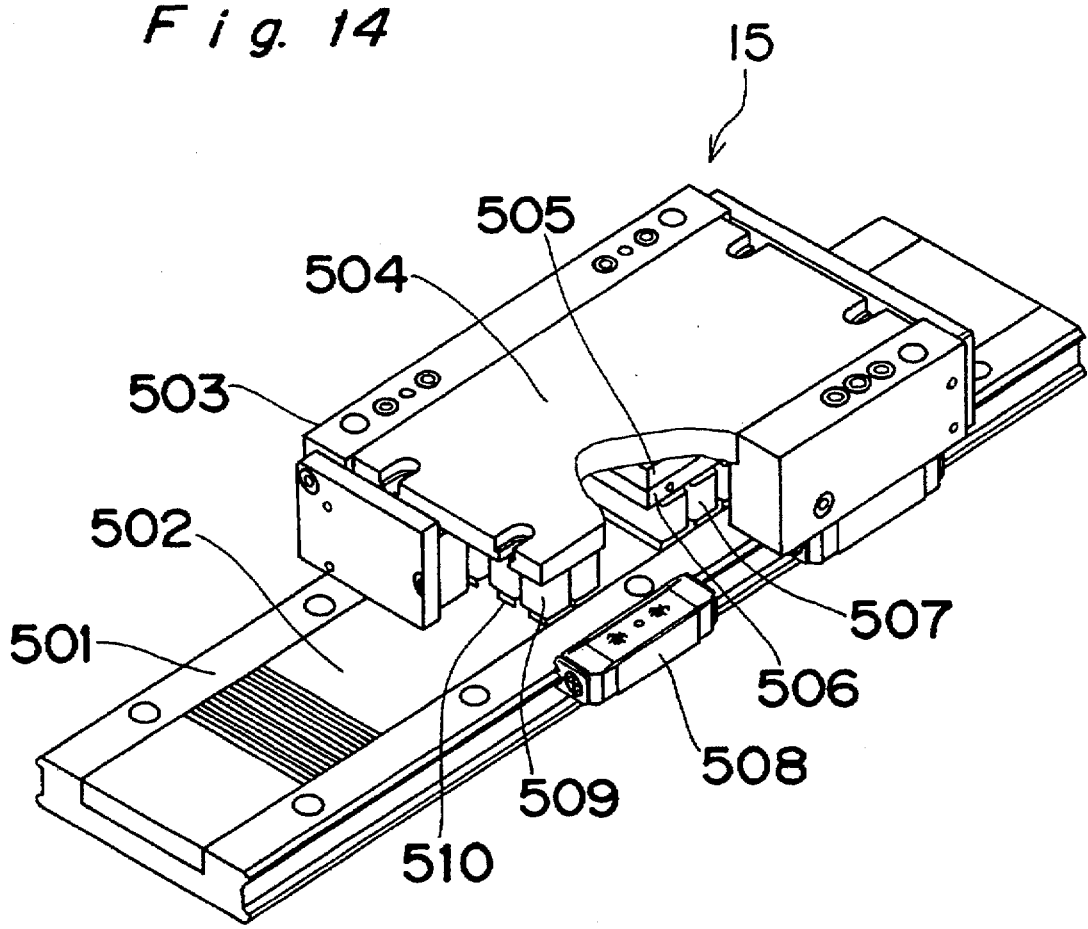
FIG. 14 is a perspective view of an X-axis robot of the apparatus in each embodiment.

FIG. 14 shows a known linear motor as an example of the X-axis robot 15. The X-axis robot 15 includes a linear movement guide rail 501, a scale 502 fixed in the guide rail 501, a slider 503 movable on the guide rail 501 and the scale 502, a plate 504, a magnet 505, a motor core 506, a motor coil 507, a liner movement guide block 508 of the slider 503 slidably contacting with the guide rail 501, a resolver coil 509, and a resolver core 510 so as to move only one direction along the guide rail 501.

In FIG. 16, the controller 17 is connected to the first and second component carrier heads 11 and 13, the X-axis robot 15, the board stage 17, the Y-axis robot 18, the wafer selecting system 200 (the X-Y table 21 and the rotating system), the slight adjustment mechanism 94, the board carrier system 50, the component reversing device 90, and the recognition camera 22 and a recognition camera 91 so as to carry out their operations under the control of the controller 700.

Figure 3:
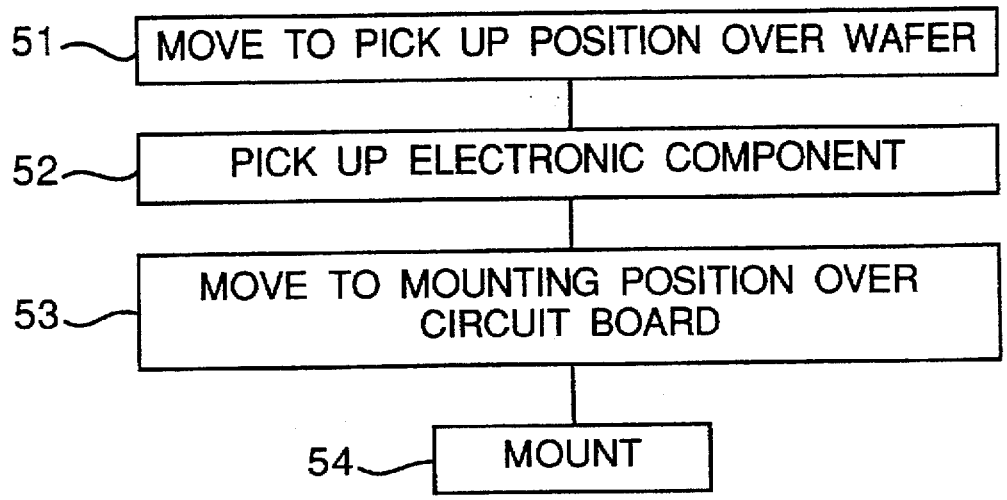
FIG. 3 is a flow chart of the movement of a first component carrier head.
Figure 4:
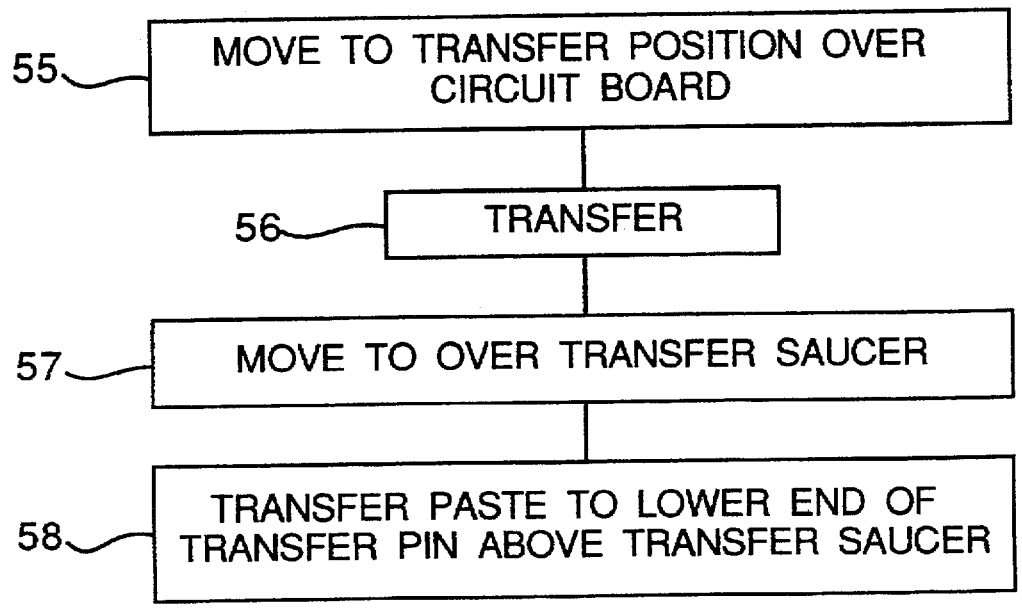
FIG. 4 is a flow chart of the movement of a second component carrier head.
Figure 5:
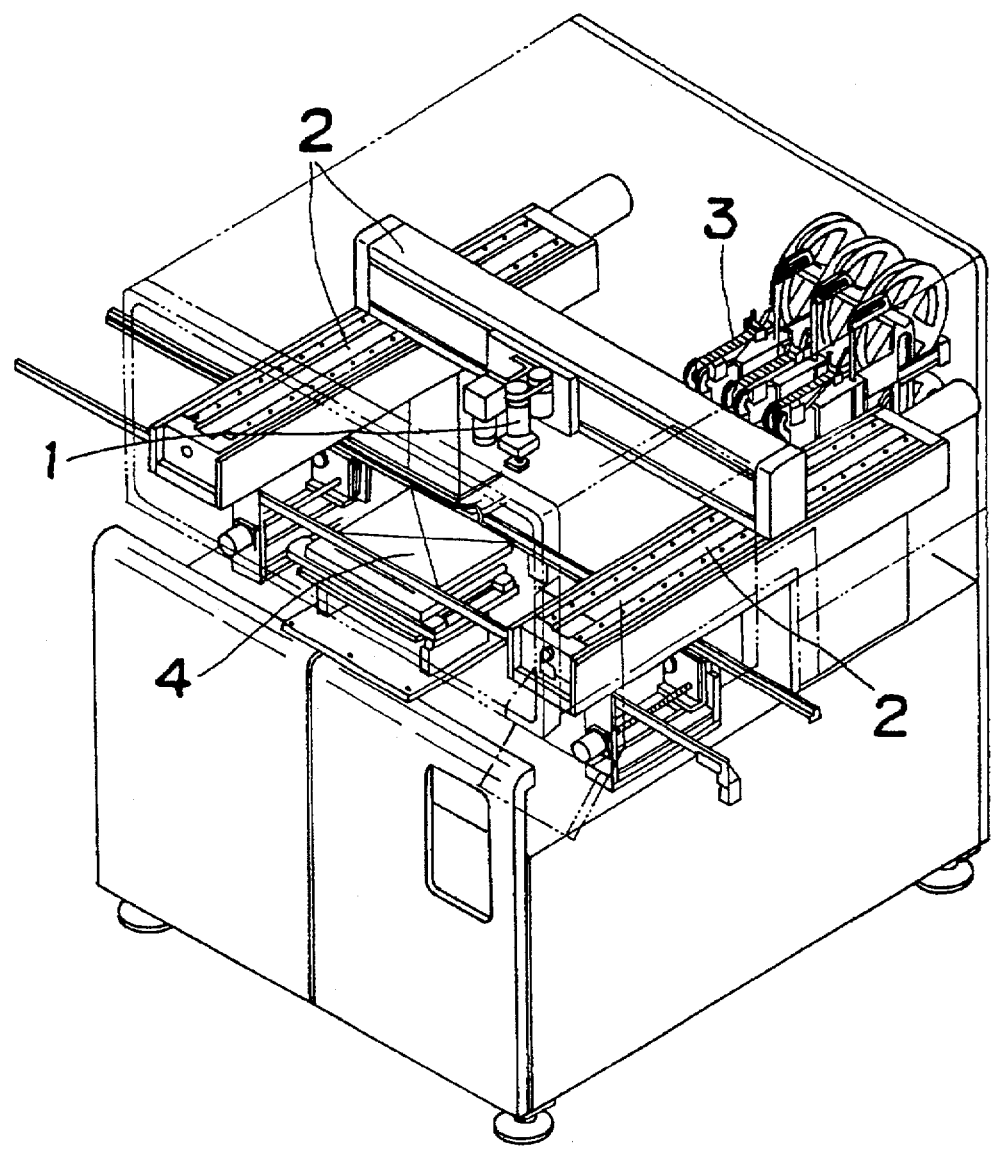
FIG. 5 is a perspective view of a conventional electronic component mounting apparatus.

The operation of the electronic component mounting apparatus in the above-described constitution will be described with reference to FIGS. 2, 3, and 4. The circuit board 16 is carried by the board carrier system 50 in the board transfer path from the right and lower side to the left and upper side of FIG. 1 and is transferred from the board carrier system 50 to the board stage 17 and held on the board stage 17 at a board holding position of the transfer path. Then, the board stage 17 holding the board 16 is moved from the board holding position to a to-be-mounted position outside of the transfer path by the Y-axis robot 18 in the Y-direction as shown in FIG. 2. Then, a position of the circuit board 16 is recognized by a recognition camera 91 (See FIG. 6) movably in the X-Y directions and roughly adjusted so as to recognize a recognition mark of the circuit board 16 by the recognition camera 91. This rough adjustment can be omitted if it is unnecessary.

Figure 15:
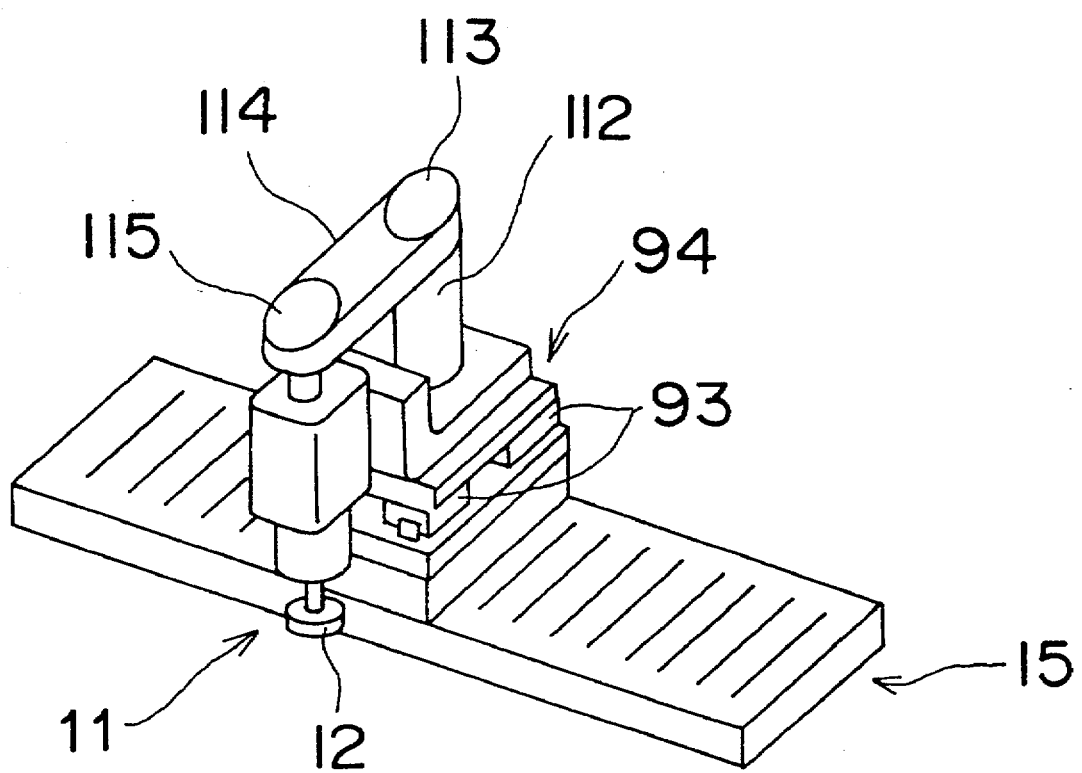
FIG. 15 is a perspective view of a slight adjustment mechanism of the component carrier head in the embodiments.

After the board 16 is located at the mounting position on the board stage 17, the first component carrier head 11 moves in a direction of an arrow A to a pickup position over the wafer 20 (step 51 in FIG. 3), then moves in a direction of an arrow B, sucks the electronic component 19 in the wafer 20, and moves in a direction opposite to the direction of the arrow B to pick up the electronic component 19 (step 52). After moving to a mounting position over the circuit board 16 in a direction opposite to the direction of the arrow A (step 53), the first component carrier head 11 descends in a direction of an arrow C, thereby mounting the electronic component 19 at a predetermined position of the circuit board 16 (step 54). When the component 19 sucked by the suction seal 12 of the first component carrier head 11 is mounted on the board 16, the position of the component 19 and the position of the board 16 are recognized by the recognition camera 91, and if necessary, the position of the component 19 is slightly adjusted in the X-Y directions by a slight adjustment mechanism 94. The slight adjustment mechanism 94 has a driving device for slightly moving the component carrier head 11 in the Y-direction and linear movement guides 93 for guiding the Y-direction movement as shown in FIG. 15.

At this time, the second component carrier head 13 moves in a direction of an arrow D to a transfer position over the circuit board 16 (step 55 in FIG. 4), further in a direction of an arrow E to transfer a paste adhering to the lower end of the head 13 to a predetermined position of the circuit board 16 (step 56). The second component carrier head 13 subsequently moves in a direction opposite to the direction of the arrow E and a direction opposite to the direction of the arrow D to over the transfer saucer 23 (step 57), descends in a direction of an arrow F and transfers the paste to a lower end of a transfer pin of the head 13 above the transfer saucer 23 (step 58). The operation of the second component carrier head 13 is carried out so as to not prevent the operation of the first component carrier head 11.

In the manner as above, both the first and second component carrier heads 11 and 13 are driven by the X-axis robot 15 in the X-axis direction independently of each other on the same axis through the numerical controls, while the circuit board 16 is moved by the Y-axis robot 18 in the Y-axis direction through the numerical control. Accordingly, the mounting apparatus of the first embodiment carries out two kinds of different processing steps concurrently, that is, the component mounting step and the paste transferring step, hence shortening a mounting time. Moreover, since the board stage 17 holding the circuit board 16 is moved by the Y-axis robot 18 only in the Y-axis direction, the transfer saucer 23 or a component feed section may be arranged immediately sideways of the board stage 17. This enables the component feed section to be in the vicinity of the front face of the equipment. The equipment is turned space-saving.

Since the X-axis driving section and the Y-axis driving section are separated in the apparatus according to the first embodiment, an inconvenience inherent in the conventional X-Y robot that a coupling section between the X-axis section and Y-axis section is insufficiently rigid is eliminated, and thus accuracy is improved.

According to the present first embodiment, the transfer saucer 23 is set at the right side of the board stage 17 and, the second component carrier head 13 as a transfer head has the paste transfer tool 14 at its lower end. Alternatively, various kinds of arrangements can be performed as shown in FIGS. 6 and 8A–11 according to second through sixth embodiments of the present invention.

Figure 6:
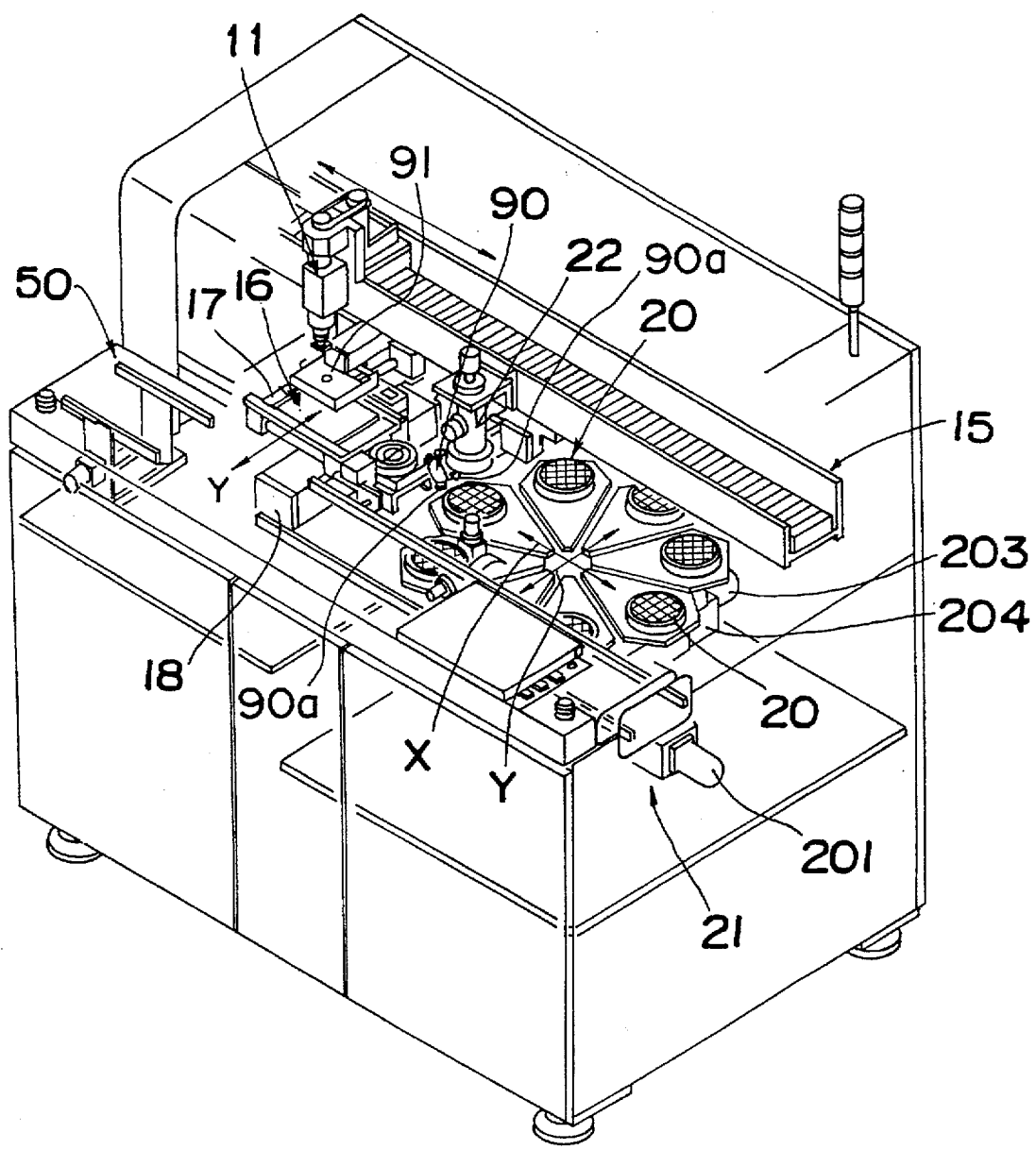
FIG. 6 is a perspective view of an electronic component mounting apparatus in a second embodiment of the present invention.

Although the two component carrier heads 11 and 13 are arranged in the first embodiment in FIG. 1, only a single component carrier head 11 can be arranged as shown in FIG. 6 as the second embodiment of the present invention. The operations carried out by the first and second component carrier heads 11 and 13 in the first embodiment are carried out by the single component carrier head 11 in the second embodiment.

Figure 8A:
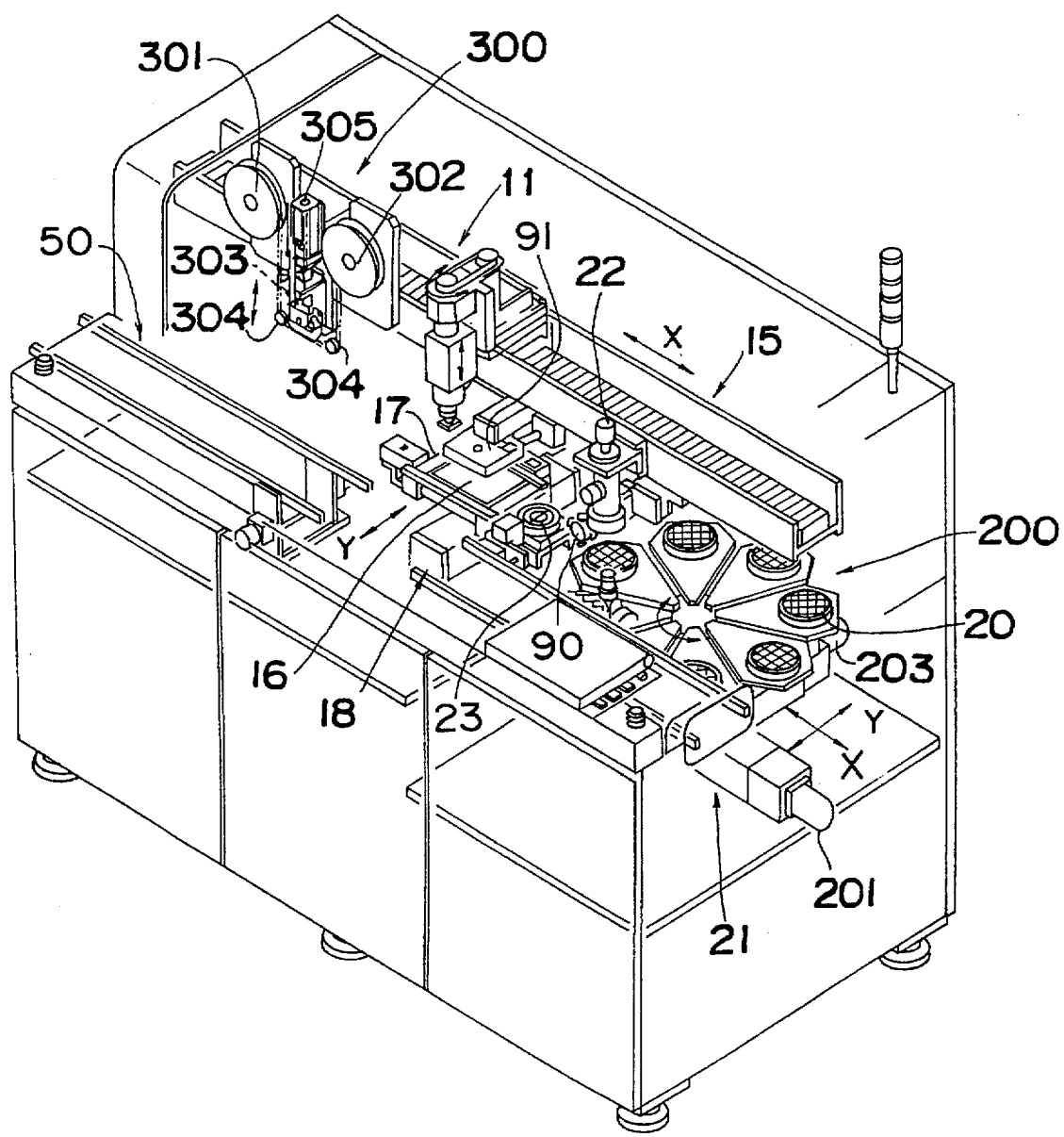
FIGS. 8A and 8B are a perspective view and a flow chart of an electronic component mounting apparatus in a third embodiment of the present invention.
Figure 8B:
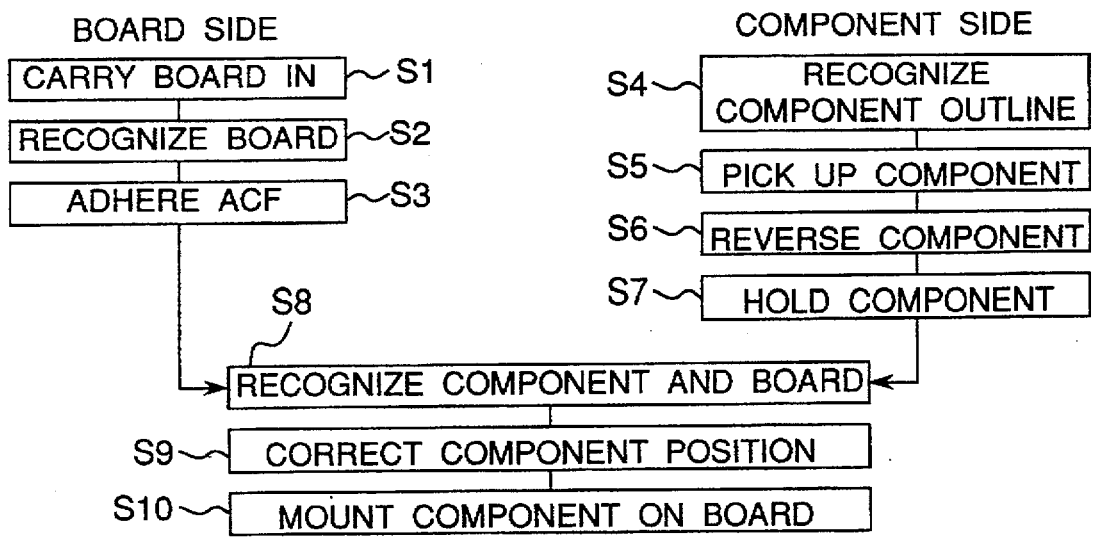

Meanwhile, in the third embodiment of FIG. 8A and 8B, when the circuit board 16 is a liquid crystal panel (glass board), a feed unit 300 for feeding anisotropic conductive films (ACF) and an ACF transfer tool 305 are placed at the left side of the board stage 17 in the apparatus of FIG. 6. Instead of the ACF feed unit 300 and the ACF transfer tool 305, an ACF transfer tool can be fitted at the lower end of the component carrier head 11. This apparatus of FIGS. 8A and 8B allows COG mounting in the ACF bonding system to be achieved. The feed unit 300 and the ACT transfer tool 305 are also connected to the controller 700 so as to carry out the operations under the control of the controller 700 as shown in FIG. 16. In the apparatus, an ACF supply tape 303 can move in the X-direction to a predetermined position, is transferred from a wheel 301 to a wheel 302 while guided by guide rollers 304, and is pressed to a predetermined position of the board 16 by a pressing member as the ACF transfer tool 305 to adhere an ACF to the board 16 by an adhesive of the ACF.

The operation of the apparatus according to the third embodiment is described below with reference to FIGS. 8A and 8B which are a perspective view and a flow chart of the apparatus. After the circuit board 16 is carried in and is held on the board stage 17 and moved to the mounting position at step S1 and the position of the board 16 is recognized by the recognition camera 91 and the position of the board 16 is roughly adjusted at step S2, the ACF is attached to the predetermined position of the board 16 at step S3.

On the other hand, the outline of the component 19 is recognized by the recognition camera 22 at step S4, and when the outline is acceptable as the result of the recognition, the component 19 is picked up by a picking-up mechanism installed in the wafer selecting system 200 at step S5. The picked-up component 19 is sucked by the suction element of the component reversing device 90 at its lower position and the sucked component 19 is rotated 180 degrees to the upper position of the suction element at step S6. Then, the component 19 sucked by the suction element is sucked by the suction seal 12 of the component carrier head 11 at step S7. Thereafter, the position of the component 19 sucked by the suction seal 12 and the position of the board 16 are recognized by the recognition camera 91 at step S8 and if necessary, the component carrier head 11 is slightly moved to correct the position of the component 19 with respect to the position of the board 16 at step S9. Then, the component 19 is mounted on the board 16 via the ACF by moving the component carrier head 11 downward at step S10. Thus, the COG mounting is carried out.

Figure 9B:
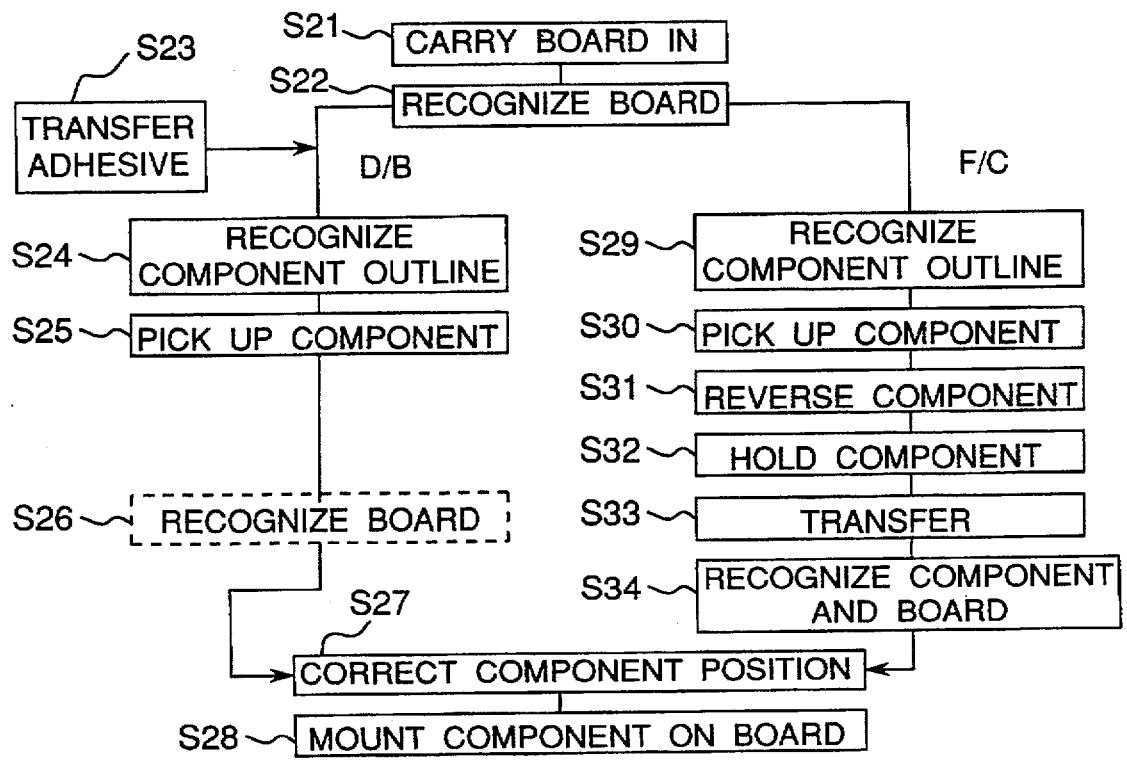
FIGS. 9A and 9B are a perspective view and a flow chart of an electronic component mounting apparatus in a fourth embodiment of the present invention.
Figure 9A:
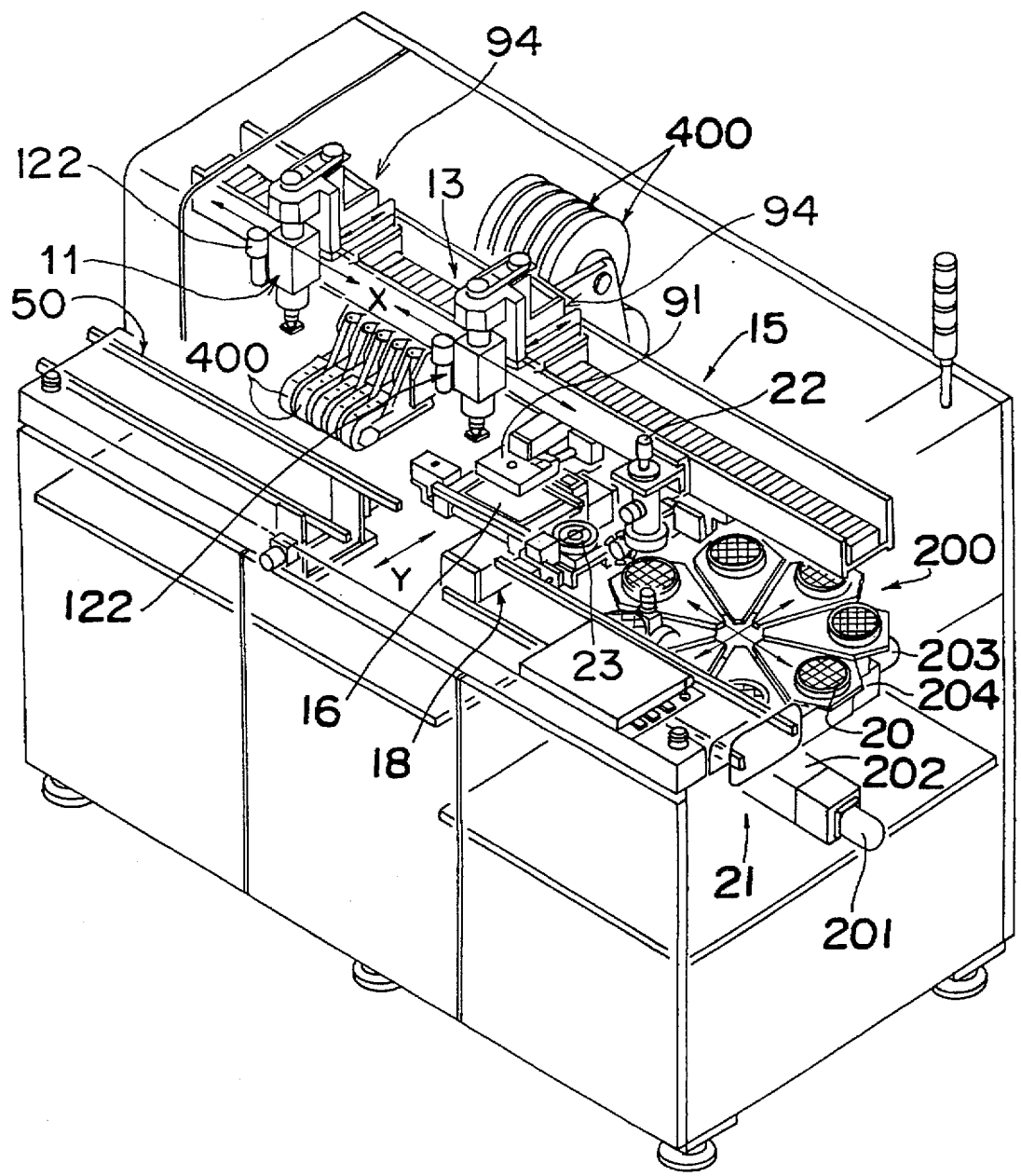

FIGS. 9A and 9B are a perspective view and a flow chart of an apparatus according to the fourth embodiment wherein component cassettes 400 accommodating electronic components for SMT mounting, e.g. Die Bonding (D/B), are arranged at the left side of the board stage 17 of the apparatus in FIG. 6 and the first and second component carrier heads 11 and 13 are arranged in the same fashion as FIG. 1. That is, the wafer selecting system 200 for COB mounting, e.g. for Flip Chip Bonding (F/C), is arranged at the right side of the board stage 17. Thus, both SMT mounting based on components supplied from the component cassettes 400 and COB mounting based on the components 19 selected from the wafer selecting system 200 can be carried out in this arrangement by the single component carrier head 11. In detail, in FIGS. 9A and 9B, the circuit board 16 is carried in and held on the board stage 17 and moved to the mounting position at step S21 and the position of the board 16 is recognized by the recognition camera 91 and the position of the board 16 is roughly adjusted at step S22, an adhesive agent (e.g. paste) is transferred from the transfer saucer 23 to the board 16 by the first component carrier head 11 at step S23. Then, on the component cassette side (Die Bonding side), the outline of an electronic component in the predetermined component cassette 400 is recognized by a recognition camera 122 attached to the first component carrier head 11 at step S24, and when the outline is acceptable as the result of the recognition, the component is sucked by the component carrier head 11 so as to pick up the component at step S25. If necessary, the position of the board 16 is recognized by the recognition camera 91 and is roughly adjusted at step S26 and the position of the component is corrected at step S27. Then, the component is mounted on the board 16 by moving the first component carrier head 11 downward at step S28. On the other hand, on the wafer selecting system side (Flip Chip bonding side), the outline of the component 19 in the wafer 20 is recognized by the recognition camera 22 at step S29, and when the outline is acceptable as the result of the recognition, the component 19 is pushed up by a pressing pin of a pick-up mechanism installed in the wafer selecting system 200 at step S30 and the picked-up component 19 is sucked by the suction element 90a of the component reversing device 90 at its lower position and the sucked component 19 is rotated 180 degrees to the upper position of the suction element 90a at step S31. Then, the component 19 sucked by the suction element 90a is sucked by the suction seal 12 of the second component carrier head 13 at step S32. Then, a paste is transferred from the transfer saucer 23 to the component 19 by the second component carrier head 13 at step S33. The position of the component 19 sucked by the suction seal 12 and the position of the board 16 are recognized by the recognition camera 91 at step S34 and if necessary, the component carrier head 11 is slightly moved to correct the position of the component 19 with respect to the position of the board 16 at step S27. Then, the component 19 is mounted on the board 16 by moving the second component carrier head 13 downward at step S28. According to the apparatus, since the second component carrier head 13 is utilized for the same purpose as the first component carrier head 11, the SMT Mounting is carried out by the first component carrier head 11 and the COB mounting is carried out by the second component carrier head 13.

Figure 10A:
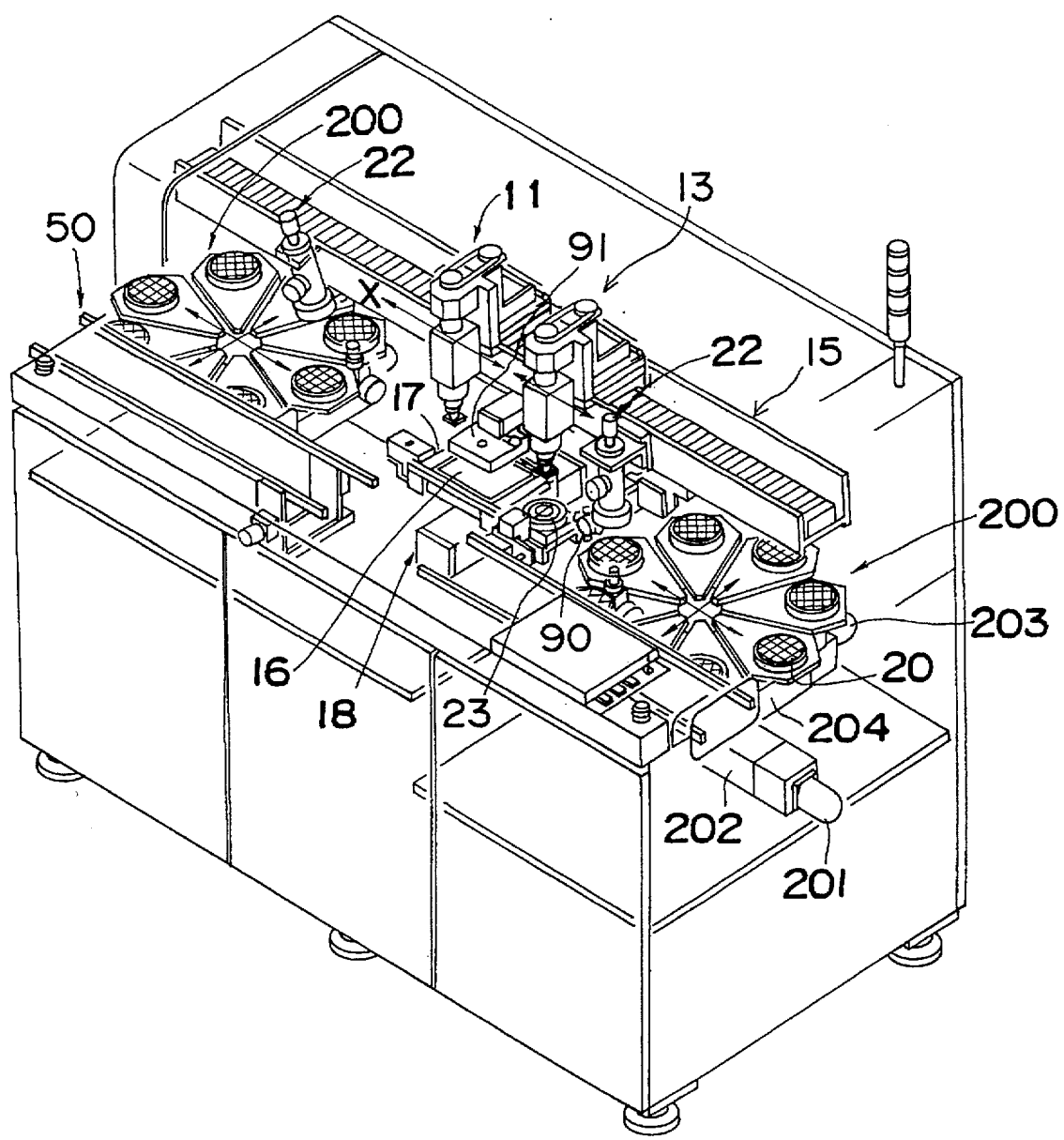
FIGS. 10A and 10B are a perspective view and a flow chart of an electronic component mounting apparatus in a fifth embodiment of the present invention.
Figure 10B:
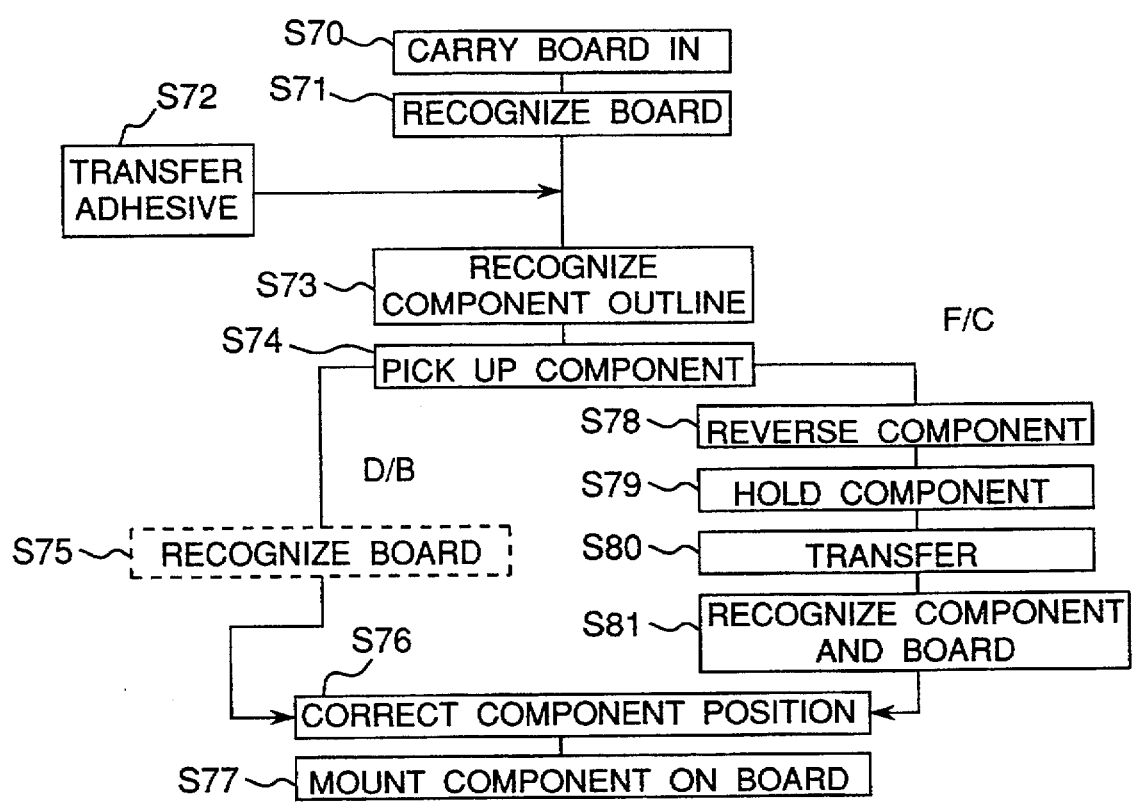

As shown in FIGS. 10A and 10B of the fifth embodiment, if the wafer selecting system 200 and the recognition camera 22 are installed also at the left side of the board stage 17 in the same fashion as at the right side in the apparatus of FIG. 6 and the first and second component carrier heads 11 and 13 are arranged in the same fashion as FIG. 1, the time for COB mounting is furthermore shortened because the COB mounting can be carried out by the two heads 11 and 13 independently. At this time, if the circuit board 16 is a lead frame, a multi-purpose monolithic circuit is realized.

The operation of the apparatus of FIGS. 10A and 10B is described below. The circuit board 16 is carried in and held on the board stage 17 and moved to the mounting position at step S70 and the position of the board 16 is recognized by the recognition camera 91 and the position of the board 16 is roughly adjusted at step S71, an adhesive agent (e.g. paste) is transferred from the transfer saucer 23 to the board 16 by the first component carrier head 11 at step S72. Then, on the left side (Die Bonding side) of the apparatus, the outline of the component 19 in the predetermined wafer 20 of the wafer selecting system 200 on the left side is recognized by the recognition camera 122 attached to the first component carrier head 11 at step S73, and when the outline is acceptable as the result of the recognition, the component 19 is pushed up by a pressing pin of a pick-up mechanism installed in the wafer selecting system 200 and held by the first component carrier head 11 at step S74. If necessary, the position of the board 16 is recognized by the recognition camera 91 and is roughly adjusted at step S75 and the position of the component 19 is corrected at step S76. Then, the component 19 is mounted on the board 16 by moving the first component carrier head 11 downward at step S77. On the other hand, on the right side (Flip Chip bonding side), the outline of the component 19 in the wafer 20 of the wafer selecting system 200 on the right side is recognized by the recognition camera 22 at step S73, and when the outline is acceptable as the result of the recognition, the component 19 is pushed up by a pressing pin of a pick-up mechanism installed in the wafer selecting system 200 at step S74 and the picked-up component 19 is sucked by the suction element 90a of the component reversing device 90 at its lower position and the sucked component 19 is rotated 180 degrees to the upper position of the suction element 90a at step S78. Then, the component 19 sucked by the suction element 90a is sucked by the suction seal 12 of the second component carrier head 13 at step S79. Then, a paste is transferred from the transfer saucer 23 to the board 16 by the first component carrier head 11 at step S80. The position of the component 19 sucked by the suction seal 12 and the position of the board 16 and the position of the component 19 are recognized by the recognition camera 91 at step S81 and if necessary, the second component carrier head 13 is slightly moved to correct the position of the component 19 with respect to the position of the board 16 at step S76. Then, the component 19 is mounted on the board 16 by moving the second component carrier head 13 downward at step S77. Thus, the COB mounting is carried out. According to the apparatus, since the second component carrier head 13 is utilized for the same purpose as the first component carrier head 11, the SMT Mounting is carried out by the first component carrier head 11 and the COB mounting is carried out by the second component carrier head 13. Alternatively, the SMT Mounting can be carried out by the first and second component carrier heads 11 and 13 at high speed by arranging the wafer selecting systems 200 wherein the reversing operations of the components 19 are unnecessary. Also, the COB mounting can be carried out at high speed by arranging the wafer selecting systems 200 wherein the reversing operations of the components 19 are necessary.

Figure 11:
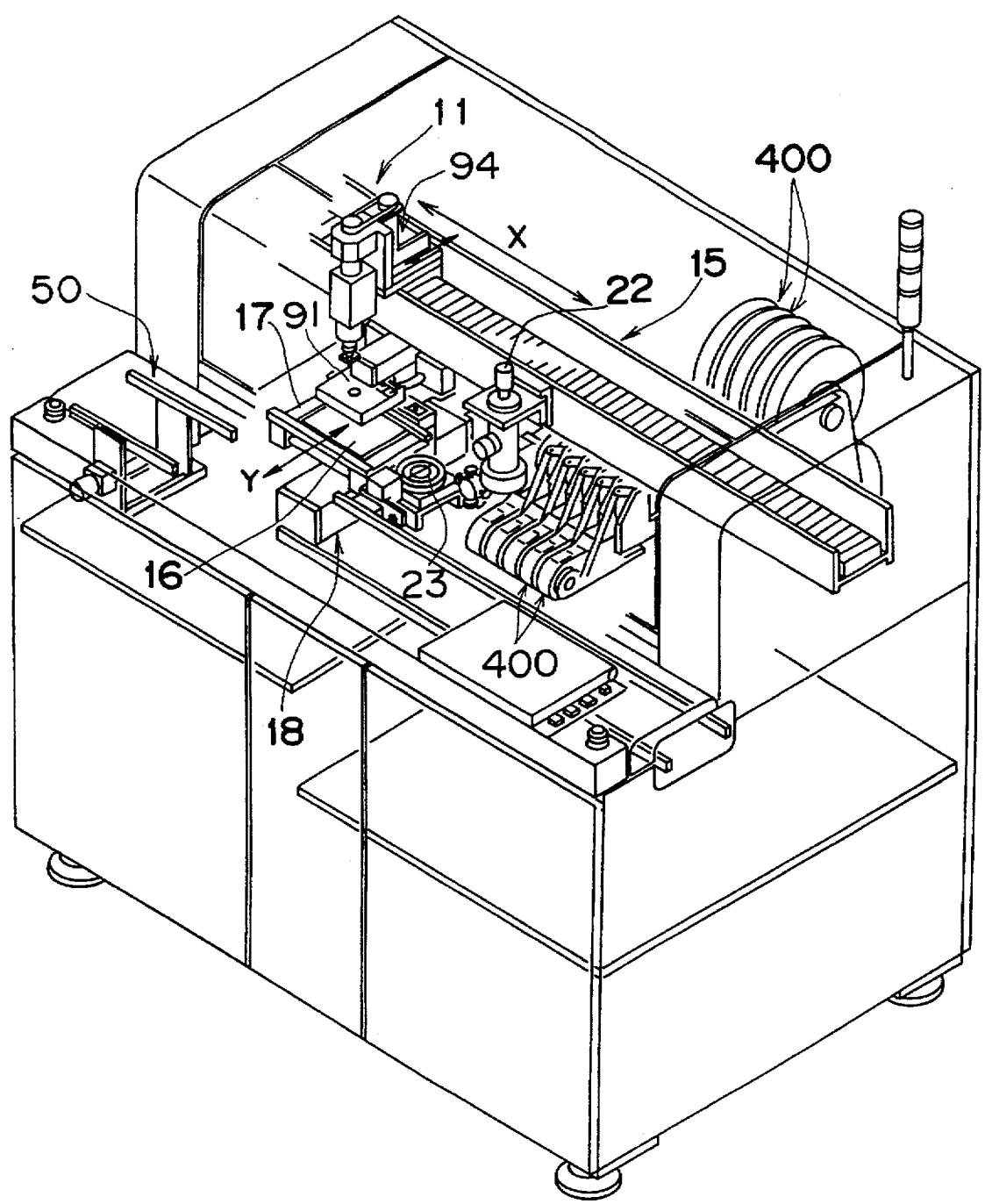
FIG. 11 is a perspective view of an electronic component mounting apparatus in a sixth embodiment of the present invention.

FIG. 11 shows an apparatus of the sixth embodiment wherein component cassettes 400 instead of the wafer selecting system 200 are arranged in the apparatus of FIG. 6. Thus, SMT mounting based on components supplied from the component cassettes 400 can be carried out in this arrangement by the single component carrier head 11.

According to some of the embodiments, the electronic component mounting apparatus constituted as above has a plurality of component carrier heads 11 and 13 on the same axis. The component carrier heads 11 and 13 are independently movable in a direction of one axis (X-direction) through the numerical controls. The electronic components are mounted in a short time in a saved space by moving the board stage 17 holding the circuit board 16 in the Y-axis direction through the numerical control.

As is described hereinabove, there are provided in the apparatus of the present invention, a feeding device for feeding a to-be-placed element including an electronic component, an anisotropic conductive film, or a paste; a holding device for holding the fed element; an element moving device for supporting and moving the holding device in a first direction and placing the element held by the holding device on a circuit board; and a board moving device for holding and moving the circuit board in a second direction generally at right angles to the first direction where the element moving device is moved. Accordingly, the mounting time is shortened, and the component feed section can be set in the vicinity of the front face of the equipment, thus saving the space. Also, accuracy is improved because of an increase of rigidity of the apparatus.

As described above, the present invention is applicable not only to COB mounting, but to a mixed way of COB mounting and SMT mounting or a multi-purpose monolithic mounting, and moreover the present invention is easily developed to be used for COG mounting of an ACF bonding system, etc.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component mounting apparatus comprising:
   an uniaxial robot extending along a first direction said robot operating uniaxially along said first direction;
   a first feeding device, arranged on only one side of said uniaxial robot, for feeding a to-be-placed element including an electronic component, an anisotropic conductive film, or a paste;
   a plurality of independently movable component carrier heads supported on said uniaxial robot, wherein each of said independently movable component carrier heads is mounted on the one side of said uniaxial robot for holding the to-be-placed element from said first feeding device, and said component carrier heads are independently movable in said first direction by said uniaxial robot in order to place the element held by one of said component carrier heads on a circuit board; and
   a board moving device for holding and moving a circuit board along a second direction which is generally at a right angle to said first direction.

2. The electronic component mounting apparatus as claimed in claim 1, further comprising a second feeding device for feeding a to-be-placed element including an electronic component, an anisotropic conductive film, or a paste, wherein said board moving device is movable between said first feeding device and said second feeding device in the first direction.

3. The electronic component mounting apparatus as claimed in claim 2, wherein the to-be-placed element is an electronic component, and said component carrier heads are operable to place the electronic component on a surface of the circuit board.

4. The electronic component mounting apparatus as claimed in claim 1, further comprising a second feeding device for feeding a to-be-placed element including an electronic component, an anisotropic conductive film, or a paste, said second feeding device being arranged at a first side of said board moving device,
   wherein said first feeding device is arranged at a second side of said board moving device.

5. The electronic component mounting apparatus as claimed in claim 4, wherein the to-be-placed element is an electronic component, and said component carrier heads are operable to place the electronic component on a surface of the circuit board.

6. The electronic component mounting apparatus as claimed in claim 1, wherein the first feeding device comprises:
   a movable device which is movable in said first direction and said second direction; and
   a rotating system provided on said movable device.

7. The electronic component mounting apparatus as claimed in claim 1, wherein each of said component carrier heads includes a mechanism for moving in said second direction for positional adjustment.

8. The electronic component mounting apparatus as claimed in claim 1, wherein each of said independently movable component carrier head has only one element holding tool.

9. The electronic component mounting apparatus as claimed in claim 8, wherein said holding tool is a suction nozzle.

* * * * *